(12) United States Patent
Groe et al.

(10) Patent No.: US 7,382,849 B1
(45) Date of Patent: Jun. 3, 2008

(54) CHARGE PUMP CIRCUIT

(75) Inventors: John B. Groe, Poway, CA (US); Joseph Austin, San Diego, CA (US)

(73) Assignee: Sequoia Communications, San Diego, CA (US)

( * ) Notice: Subject to any disclaimer, the term of this patent is extended or adjusted under 35 U.S.C. 154(b) by 689 days.

(21) Appl. No.: 10/646,530

(22) Filed: Aug. 23, 2003

Related U.S. Application Data

(60) Provisional application No. 60/405,669, filed on Aug. 24, 2002.

(51) Int. Cl.
*H03D 3/24* (2006.01)
(52) U.S. Cl. ............ 375/374; 375/373; 375/375; 375/376; 327/157
(58) Field of Classification Search .......... 375/374, 375/373, 375, 376; 327/148, 156, 157; 331/8, 331/25, 17
See application file for complete search history.

(56) References Cited

U.S. PATENT DOCUMENTS

| | | | | |
|---|---|---|---|---|
| 5,508,660 | A | * | 4/1996 | Gersbach et al. ............. 331/17 |
| 5,945,855 | A | * | 8/1999 | Momtaz ...................... 327/157 |
| 6,781,425 | B2 | * | 8/2004 | Si ............................. 327/148 |

* cited by examiner

*Primary Examiner*—Phuong Phu
(74) *Attorney, Agent, or Firm*—Cooley Godward Kronish LLP; Daniel Tagliaferri

(57) ABSTRACT

Charge pump circuit. A charge pump circuit is provided for use in a phase-lock loop circuit. The charge pump circuit comprises a charge pump core circuit that outputs a control voltage. The charge pump circuit also comprises a replica circuit that is coupled to the charge pump core circuit, wherein the replica circuit receives the control voltage and produces one or more bias signals that are coupled to the charge pump core circuit to minimize the difference between charge up and charge down currents generated by the charge pump core circuit.

18 Claims, 8 Drawing Sheets

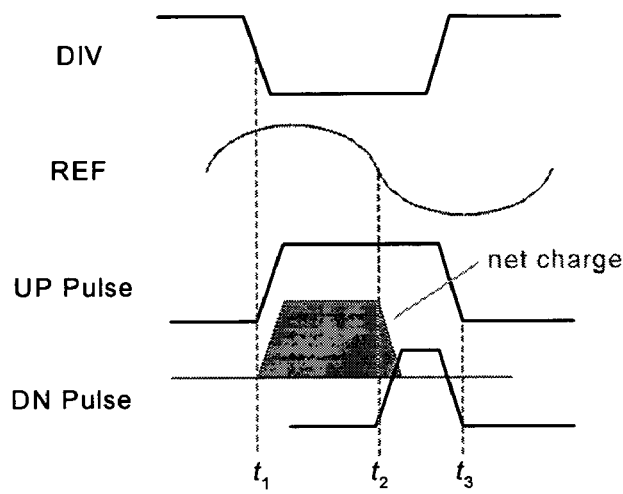
Figure 4
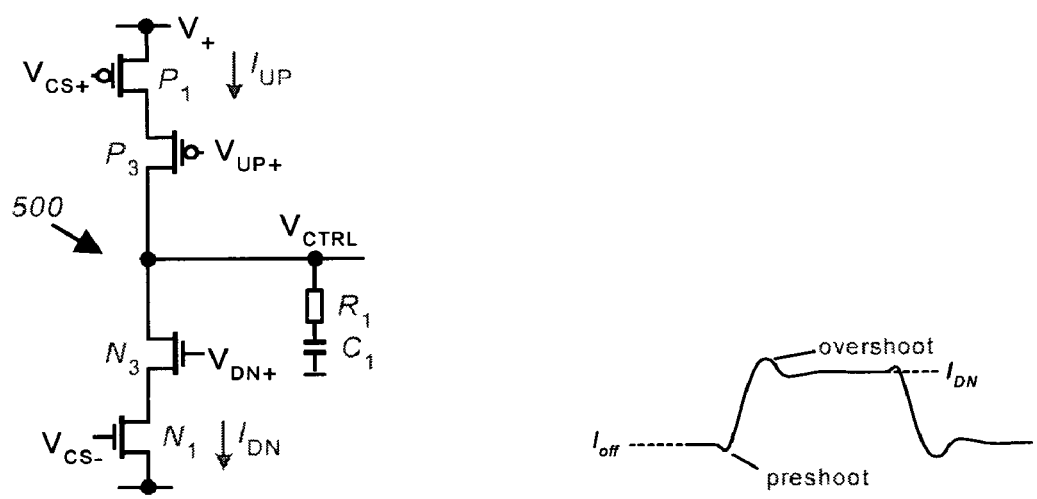
Figure 5
Figure 6

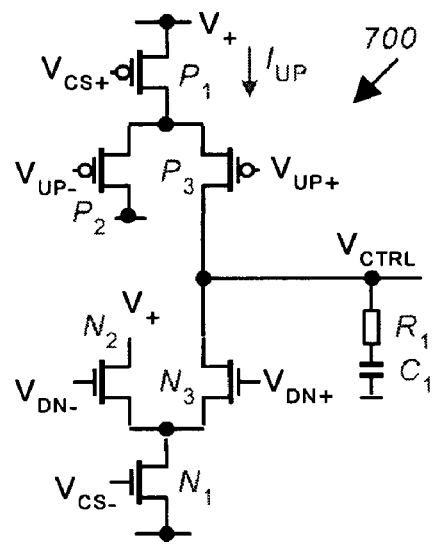
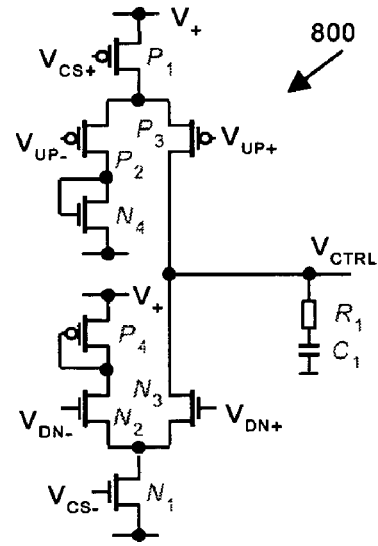
Figure 7
Figure 8
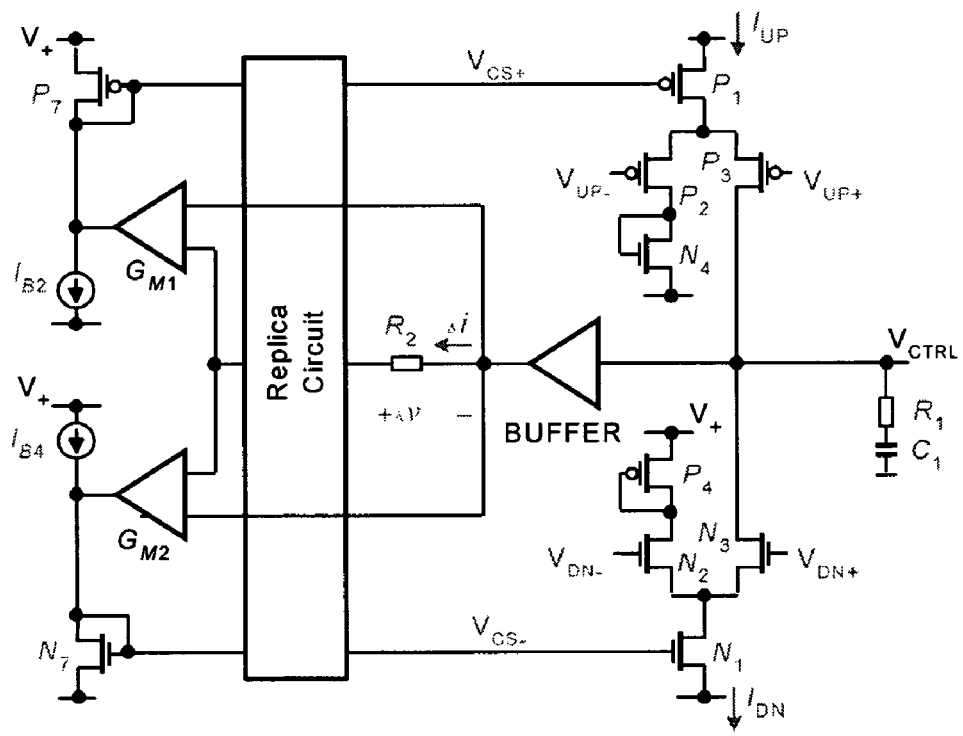
Figure 9

CHARGE PUMP CIRCUIT

CROSS REFERENCE TO RELATED APPLICATIONS

This application claims the benefit of priority from a pending U.S. Provisional Patent Application entitled "IMPROVED CHARGE PUMP CIRCUIT" Ser. No. 60/405,669 filed on Aug. 24, 2002, the disclosure of which is incorporated by reference herein in its entirety for all purposes.

FIELD OF THE INVENTION

The present invention relates generally to phase-locked loop systems, and more particularly, to phase-locked loop systems that utilize charge pump circuits.

BACKGROUND OF THE INVENTION

Phase-locked loops (PLL) find widespread use in frequency synthesizers, clock recovery circuits, phase modulators, and frequency demodulators. Generally, a PLL consists of a voltage-controlled oscillator (VCO), counter, phase/frequency detector (P/FD), charge pump (CP), and RC integration filter.

The phase-locked loop relies on feedback to drive the frequency difference and phase offset between a reference signal and the output of the counter towards zero. Its operation depends on the circuits that comprise the system; and as such, variations in circuit parameters alter the response of the system, lower the stability of the feedback loop, and introduce distortion. The charge pump and integration filter are circuits that are especially sensitive.

It is therefore desirable to improve the performance of the charge pump so that the PLL can better adapt to parameter changes.

SUMMARY OF THE INVENTION

In one or more embodiments, a PLL system is provided that includes an improved charge pump (CP) circuit that operates linearly and compensates for parameter variations. The improved CP circuit produces fast and symmetric current pulses with reduced ringing and overshoot.

In one embodiment, a charge pump circuit is provided that comprises a replica circuit that provides a current difference between charge (UP) and discharge (DN) currents, and a buffer coupled to the replica circuit to buffer a received control voltage.

In one embodiment, a charge pump circuit is provided for use in a phase-lock loop circuit. The charge pump circuit comprises a charge pump core circuit that outputs a control voltage. The charge pump circuit also comprises a replica circuit that is coupled to the charge pump core circuit, wherein the replica circuit receives the control voltage and produces one or more bias signals that are coupled to the charge pump core circuit to minimize the difference between charge up and charge down currents generated by the charge pump core circuit.

In one embodiment, a method is provided for operating a charge pump circuit in a phase-lock loop circuit. The method comprises generating an output control voltage at a charge pump core circuit, generating one or more bias signals based on the control voltage, and adjusting the operation of the core circuit based on the one or more bias signals so as to minimize a difference between charge up and charge down currents.

In one embodiment, a charge pump circuit is provided for use in a phase-lock loop circuit. The charge pump circuit comprises a charge pump core circuit means for outputting a control voltage. The charge pump circuit also comprises a replica circuit means for receiving the control voltage and producing one or more bias signals that are coupled to the charge pump core circuit means to minimize the difference between charge up and charge down currents generated by the charge pump core circuit means.

BRIEF DESCRIPTION OF THE DRAWINGS

The foregoing aspects and the attendant advantages of the embodiments described herein will become more readily apparent by reference to the following detailed description when taken in conjunction with the accompanying drawings wherein:

FIG. 4 shows a timing diagram that illustrates the signal timing of the circuits of FIG. 3;

FIG. 5 shows one embodiment of a CP core circuit;

FIG. 6 shows a signal diagram that illustrates ringing and overshoot in the current pulses connected to an integration filter of the CP of FIG. 5;

FIG. 7 shows one embodiment of a CP core circuit where differential pair switches replace single switch transistors used in the CP core circuit of FIG. 5;

FIG. 8 shows one embodiment of the CP core circuit where a diode-connected transistor is added to the CP core circuit of FIG. 7;

FIG. 9 shows a detail diagram of one embodiment of a CP circuit that operates to minimize the difference in the charge ($I_{UP}$) and discharge ($I_{DN}$) currents;

DETAILED DESCRIPTION

In one or more embodiments, a PLL system is provided that includes an improved charge pump (CP) circuit that operates linearly and compensates for parameter variations.

Figure 1:
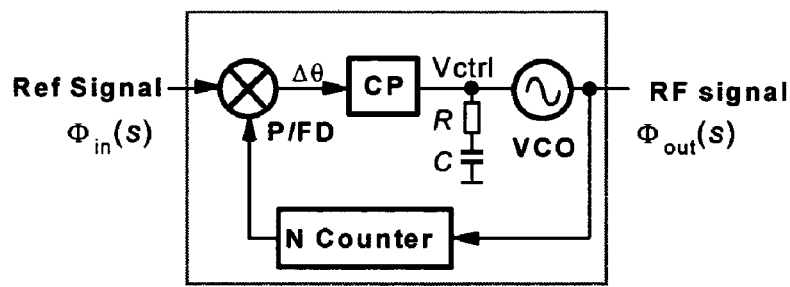
FIG. 1 shows one embodiment of a PLL.

FIG. 1 shows one embodiment of a PLL that comprises a charge pump (CP), RC integration filter, voltage-controlled oscillator (VCO), N-counter, and a phase/frequency detector (P/FD). The PLL relies on feedback to drive the frequency difference and phase offset between a reference (Ref) signal and the output of the N-counter towards zero. The operation of the PLL may also depend on the circuits that comprise the system; and as such, variations in circuit parameters alter the response of the system, lower the stability of the feedback loop, and introduce distortion. The CP and RC integration filter are circuits that may be especially sensitive.

Figure 2:
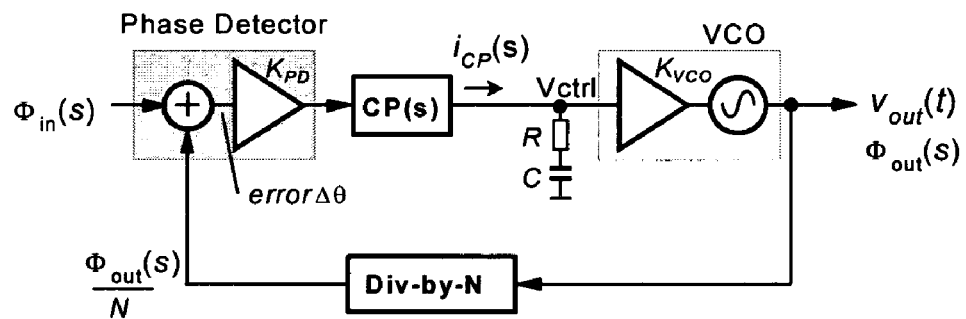
FIG. 2 shows a mathematical model of the PLL of FIG. 1.

FIG. 2 shows a mathematical model of the PLL of FIG. 1. The VCO produces an output signal ($V_{out}$) at a frequency set by control voltage ($v_{ctrl}$) that is expressed as;

$$V_{out}(t) = A_c \cos(\omega_{free} t + K_{VCO} \int v_{ctrl}(t) dt)$$

where $\omega_{free}$ is the free-running frequency of the oscillator and $K_{vco}$ is its gain function. The gain function $K_{vco}$ describes the relationship between the excess phase of the carrier $\Phi_{out}(s)$ and the control voltage $v_{ctrl}$, i.e.

$$\frac{\Phi_{out}(s)}{v_{ctrl}(s)} = \frac{K_{vco}}{s}$$

The Div-by-N counter simply divides the output phase $\Phi_{out}(s)$ by N. When the PLL is locked, the phase/frequency detector and CP combination generate an output signal ($i_{CP}(t)$) that is proportional to the phase difference (error $\Delta\theta$) between the two periodic signals input to the phase detector. The CP output signal can be expressed as;

$$i_{CP}(s) = K_{PD} \frac{\Delta\theta(s)}{2\pi}$$

A simple RC integration filter, consisting of resistor R and capacitor C, transforms the CP output signal to the control voltage $V_{ctrl}$, which can be expressed as;

$$v_{ctrl}(s) = i_{out}(s)\left(R + \frac{1}{sC}\right)$$

Combining the above transfer functions yields the composite transfer function;

$$T(s) = \frac{K_{PD} K_{VCO} \left(Rs + \frac{1}{C}\right)}{s^2 + K_{PD} K_{VCO} \frac{1}{N}\left(Rs + \frac{1}{C}\right)}$$

where a zero (at 1/RC) has been added to the second order system to stabilize it.

The phase/frequency detector and CP define the parameter $K_{PD}$. These circuits compare the output of the feedback N-counter to the reference signal $\Phi_{in}$ and generate the output signal $I_{cp}(t)$ representing their phase difference.

Figure 3:
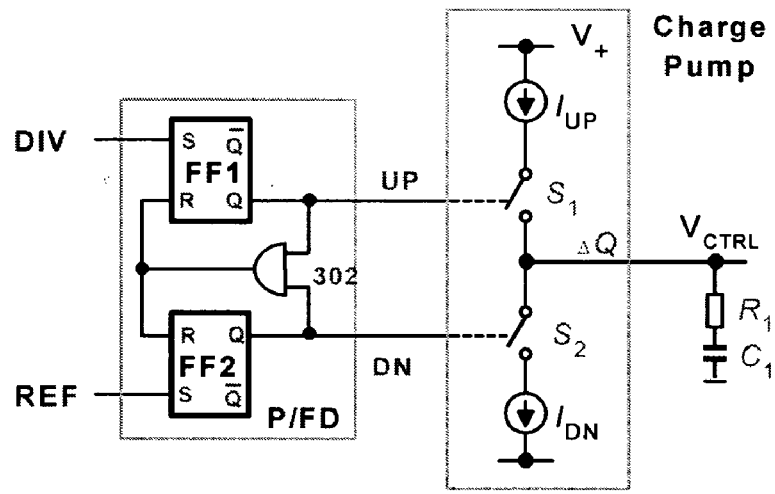
FIG. 3 shows a circuit diagram that illustrates the operation of a phase/frequency detector and a CP circuit included in the PLL of FIG. 1.

FIG. 3 shows a circuit diagram that illustrates the operation of the phase/frequency detector and CP circuits included in the PLL of FIG. 1. FIG. 4 shows a timing diagram that illustrates the signal timing of the circuits of FIG. 3.

Referring again to FIG. 3, the phase/frequency detector (P/FD) tracks the N-counter's output signal (expressed as DIV) and the reference signal (expressed as REF), thereby triggering flip-flops (FF1 and FF2) on the active falling edges of these signals. An AND gate 302 resets the flip-flops, forcing both UP and DN pulses low, shortly after the triggering of the second flip-flop (FF2) occurs. As such, the UP and DN pulses overlap slightly and stop at the same time, as illustrated in FIG. 4.

The P/FD drives the CP, which comprises a pair of switches $S_1$ and $S_2$ that connect current sources $I_{UP}$ and $I_{DN}$ to the integration filter ($R_1$, $C_1$). An UP pulse closes switch $S_1$ and directs charge to the integration filter, raising the control voltage $v_{ctrl}$. Similarly, a DN pulse closes switch $S_2$ and removes charge from the integration filter, lowering the control voltage $v_{ctrl}$. The control voltage $v_{ctrl}$, in turn, sets the frequency of the voltage-controlled oscillator (VCO in FIG. 2).

Ideally, the CP circuit is both symmetrical and insensitive to the level of the control voltage $v_{ctrl}$. The net charge ($\Delta Q$) transferred or removed from the integration filter is proportional to the time difference ($\Delta t$) between the active edges of the N-counter's output signal (DIV) and the reference signal (REF), and can be expressed as;

$$\Delta Q = K_{PD} I \Delta t$$

where $K_{PD}$ is the associated scaling factor and I is the current level—either $I_{UP}$ or $I_{DN}$. It may also be important that these currents be equal and therefore cancel during the overlap of the UP and DN pulses, otherwise, an error occurs.

In one embodiment, the current sources $I_{UP}$ and $I_{DN}$ and the switches $S_1$ and $S_2$ are implemented using CMOS transistors. In one embodiment, the current source transistors operate in the saturation region with $V_{DS} \geq V_{GS} - V_T$. In this region, the applied gate-source voltage $V_{GS}$ sets the drain current $I_D$ as expressed by;

$$I_D = \frac{\mu C_{OX}}{2} \frac{W}{L}(V_{GS} - V_T)^2 [1 + \lambda(V_{DS} - V_{GS} - V_T)]$$

where the $\mu$ is the carrier mobility, $C_{OX}$ is the oxide capacitance, W and L are the device dimensions, $V_T$ is the threshold voltage, and $\lambda$ is the channel-length modulation coefficient. The voltage difference $V_{GS} - V_T$ is oftentimes noted as the overdrive or effective voltage $V_{eff}$. In other applications, $V_{DS} < V_{GS} - V_T$ and the transistor operates in the linear region with $I_D$ given by;

$$I_D = \mu C_{OX} \frac{W}{L}\left[(V_{GS} - V_T)V_{DS} - \frac{V_{DS}^2}{2}\right] \text{ for } V_{DS} < V_{GS} - V_T$$

Therefore, to operate the transistor in saturation mode, the minimum drain-source $V_{DS(sat)}$ is approximated by;

$$V_{DS(sat)} \approx \sqrt{\frac{I_D}{\kappa}}$$

where $\kappa$ is the intrinsic gain of the device $$\frac{\mu C_{OX}}{2} \frac{W}{L}$$

and $\lambda$ is assumed to be small.

Phase-locked loops may target a specific frequency or range of frequencies. The feedback system adapts to different device parameters and circuit responses through changes in the control voltage $v_{ctrl}$. Supporting a wide control voltage range provides for lower VCO sensitivity ($K_{VCO}$) and improved noise immunity. Unfortunately, this may also mean dramatic changes in the operating bias for the transistors in the CP circuit. As a result, the symmetry, matching, and overall performance of the CP circuit may suffer.

FIG. 5 shows one embodiment of a CP core circuit. Transistors $P_3$, $N_3$ act as switches and connect current-source transistors $P_1$, $N_1$ to the integration filter. These switches also set the drain-source voltage $V_{DS}$ applied to the current sources. To transfer an accurate charge to the integration filter ($R_1$, $C_1$) and to operate devices $P_1$, $P_3$ in the saturation mode, the following two conditions should be met;

$$V_{UP+} < V_+ - + V_{DS(sat)P1} - V_{GSP2} \quad V_{ctrl} < V_+ - V_{DS(sat)P1} - V_{DS(sat)P2}$$

Increasing voltage $V_{UP+}$, collapses the drain-source voltage available to the current-source transistor $P_1$ and thereby prevents any charge transfer.

Similarly, to remove an accurate charge from the integration filter and to operate devices $N_1$, $N_3$ in the saturation mode, the following two conditions should be met;

$$V_{DN+} > V_{GSP2} + V_{DS(sat)N1} \quad V_{ctrl} > V_{DS(sat)N2} + V_{DS(sat)N1}$$

Lowering voltage $V_{DN+}$ prevents any charge transfer. This means that the drain-source voltage applied to current-source transistors $P_1$ and $N_1$ actually switches, charging and discharging any associated device capacitances.

FIG. 6 shows a signal diagram that illustrates how the charging and discharging action, described with reference to the CP core circuit of FIG. 5, may create ringing and overshoot in the current pulses connected to the integration filter. This adversely affects the switching times of the CP circuit, altering the net charge transferred and degrading the performance of the phase-locked loop.

FIG. 7 shows one embodiment of a CP core circuit 700 where differential pair switches replace the single switch transistors that were used in the CP core circuit 500. Transistors $P_2$ and $P_3$ form one of the differential pair switches and operate to steer current $I_{UP}$ either to the integration filter or directly to ground. The following voltage difference ($\Delta V_{UP}$) is required to ensure complete switching, with all the current $I_{UP}$ flowing through one of the devices—either transistor $P_2$ or $P_3$—so that;

$$\Delta V_{UP} > \sqrt{\frac{2I}{\kappa}}$$

Ideally, the differential pair switch maintains a fixed voltage at the drain of transistor $P_1$. In practice, this voltage may change due to voltage and impedance differences seen at the drain of transistors $P_2$ and $P_3$.

FIG. 8 shows one embodiment of a CP core circuit 800. The CP core circuit 800 comprises the CP core circuit 700 where a diode-connected transistor $N_4$ is added to raise the voltage and impedance seen by the drain of transistor $P_2$. As a result, the two transistors ($P_2$ and $P_3$) closely match, thereby reducing the voltage changes at the drain of transistor $P_1$, which improves the performance of the CP core circuit 800. Diode-connected transistor $P_4$ serves a similar purpose.

The current source transistors $P_1$, $N_1$ generally have long-channel geometries and high effective gate-source bias voltages ($V_{eff}$) to reduce channel-length modulation effects, minimize parasitic capacitance, and improve matching. The effective voltage also corresponds to the minimum drain-source voltage for operation in saturation mode $V_{DS(sat)}$ since;

$$V_{DS(sat)} \approx \sqrt{\frac{I_D}{\kappa}}$$

and as a result;

$$V_{DS(sat)N1} \leq V_{ctrl} \leq V_+ - V_{DS(sat)P1}$$

The effective voltage is typically several hundred millivolts.

An ideal charge pump circuit generates matching charge ($I_{UP}$) and discharge ($I_{DN}$) currents so that these currents cancel each other when the UP and DN pulses overlap. In practice, this is challenging because the current sources are implemented using complimentary devices—PMOS and NMOS transistors—and therefore may be dependent upon different parameters.

FIG. 9 shows a detail diagram of one embodiment of a CP circuit that operates to minimize the difference in the charge ($I_{UP}$) and discharge ($I_{DN}$) currents. The CP circuit comprises the CP core circuit 800 and a replica circuit that duplicates the core circuit 800. The replica circuit shares the same bias conditions including the output voltage ($v_{ctrl}$), which is forced through a buffer amplifier (BUFFER) and connects to the replica circuit through resistor $R_2$. The forcing action may require the buffer amplifier to supply an output current $\Delta i$, indicating that $I_{UP}$ is different from $I_{DN}$. For example, if $\Delta i$ is positive (current flows towards the replica circuit), then $I_{DN}$ is greater than $I_{UP}$. Similarly, if $\Delta i$ is negative (current flows towards buffer amplifier), then $I_{UP}$ is greater than $I_{DN}$. The difference current $\Delta i$ may be due to device mismatches or the level of the control voltage, $V_{ctrl}$.

Any output current $\Delta i$ is sensed by resistor R2 and amplified by error amplifiers $G_{M1}$ and $G_{M2}$. In one embodiment, the amplifiers $G_{M1}$ and $G_{M2}$ are transconductance amplifiers that convert an input differential voltage to an output current. The output currents from error amplifiers $G_{M1}$ and $G_{M2}$ adjust bias currents IB2 and IB4, which are mirrored to the replica circuit and the CP core current sources (transistors $P_1$ and $N_1$). The two error amplifiers ($G_{M1}$ and $G_{M2}$) are part of feedback loops that reduce the current $\Delta i$, and thus the difference in the replica circuit's as well as the charge pump's currents ($I_{UP}$ and $I_{DN}$).

Figure 10:
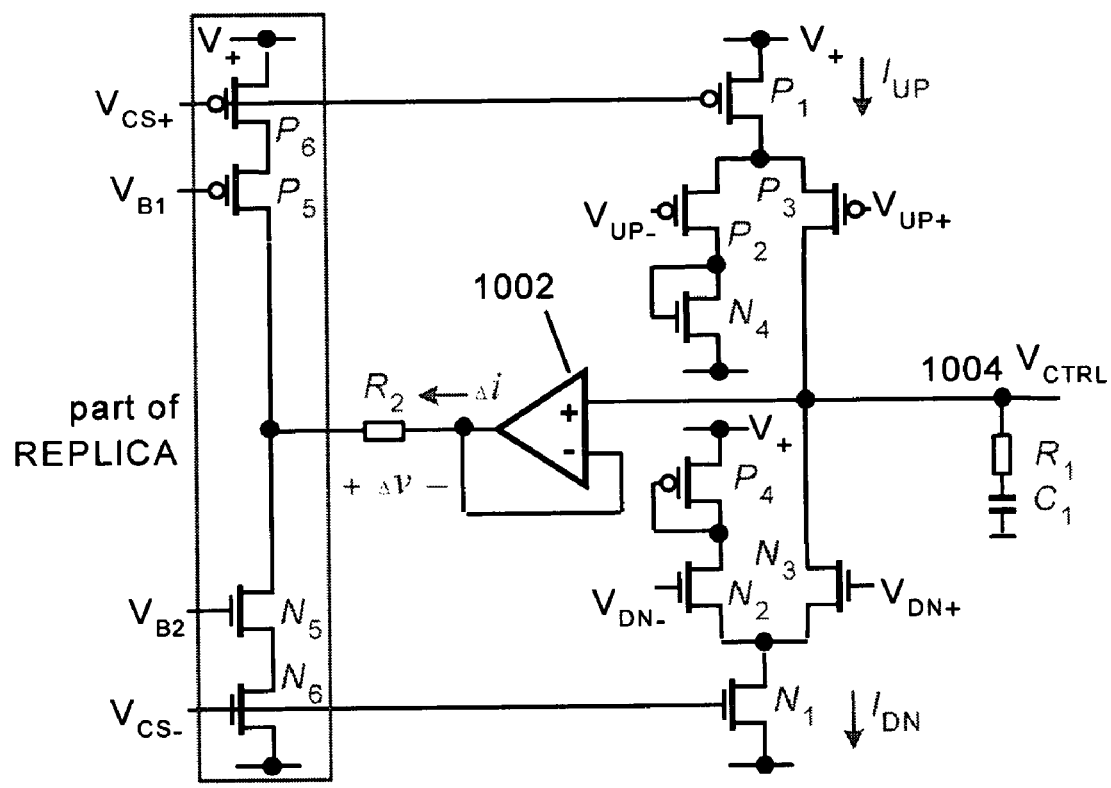
FIG. 10 shows a detailed view of one embodiment of a buffer circuit that operates to minimize the difference in the charge ($I_{UP}$) and discharge ($I_{DN}$) currents in a CP circuit.

FIG. 10 shows a detailed view of one embodiment of a buffer circuit that operates to minimize the difference in the charge ($I_{UP}$) and discharge ($I_{DN}$) currents in a CP circuit. The buffer circuit uses a buffer amplifier 1002 and resistor $R_2$ to force a replica circuit (constructed using transistors that match $P_5$, $P_6$ and $N_5$, $N_6$) to the same control voltage $v_{ctrl}$ that is input to the charge pump circuit at node 1004. In this way, the buffer circuit supplies or sinks the necessary current $\Delta i$ to establish the control voltage $v_{ctrl}$ at the replica circuit, where;

$$\Delta i = I_{N6} - I_{P6} \approx I_{DN} - I_{UP}$$

and develops a proportional voltage across resistor $R_2$ equal to $\Delta iR_2$.

Figure 11:
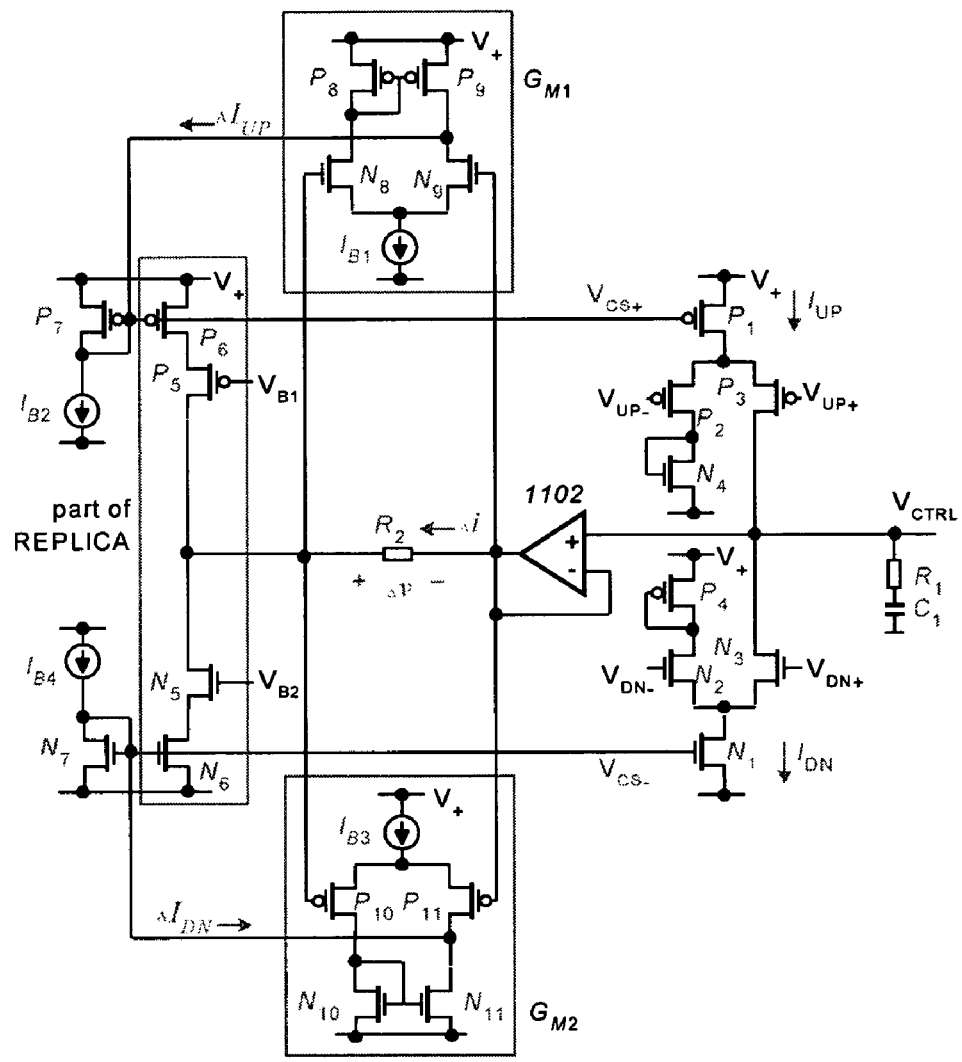
FIG. 11 shows a detailed view of error amplifier circuits for use in a CP circuit.

FIG. 11 shows a detailed view of error amplifier circuits ($G_{M1}$, $G_{M2}$) for use in a CP circuit. In one case, with regards to the circuit $G_{M1}$, the voltage developed across resistor $R_2$ is zero, and as such, bias current $I_{B1}$ splits equally between transistors $N_8$ and $N_9$, with $I_{N8}=I_{N9}$, ($I_{N8}$ and $I_{N9}$ are the currents through transistors $N_8$ and $N_9$, respectively. Since transistors $P_8$ and $P_9$ mirror current $I_{N8}$, current $I_{P9}$ essentially equals current $I_{N9}$ and the difference current $\Delta I_{UP}$ approaches zero. When the operational amplifier 1102 supplies current to the replica circuit, it indicates that $I_{UP}$ is less than $I_{DN}$. The voltage developed across resistor $R_2$ drives transistor $N_9$ to pull more current than transistor $N_8$. The difference current $\Delta I_{UP}$ is then pulled through transistor $P_7$, with;

$$I_{P7}=I_{B2}+\Delta I_{UP} \approx I_{UP}$$

where current source $I_{B1}$ (and thus $\Delta I_{UP}$) depends on the output of the operational amplifier 1102. That is to say that the current $I_{B1}$ exists only when the voltage $v_{ctrl}$ rises significantly above its lower limit, $V_{DS(sat)N1}$. As a result, the difference current $\Delta I_{UP}$ is generally positive.

With regards to $G_{M2}$, transistors $P_{10}$, $P_{11}$, $N_7$, and $N_{10}$, $N_{11}$, along with current sources $I_{B3}$ and $I_{B4}$ form a network similar to the one described above that adjusts current-source transistors $N_1$ and $N_6$. When the operational amplifier 1102 sinks current from the replica circuit, it indicates that $I_{UP}$ is larger than $I_{DN}$. This creates a voltage across resistor $R_2$ that steers more current through transistor $P_{11}$ than transistor $P_{10}$. As a result, a difference current $\Delta I_{DN}$ is directed towards transistor $N_7$, making;

$$I_{N7}=I_{B4}+\Delta I_{DN} \approx I_{DN}$$

where the bias current $I_{B3}$ (and thus $\Delta I_{DN}$) depends on the output of the operational amplifier 1102. Although it operates similarly to bias current $I_{B1}$, in this case, current $I_{B3}$ exists only when the voltage $v_{ctrl}$ falls significantly below its upper limit, $V_+-V_{DS(sat)P1}$. This generally makes $\Delta I_{DN}$ positive.

Figure 12:
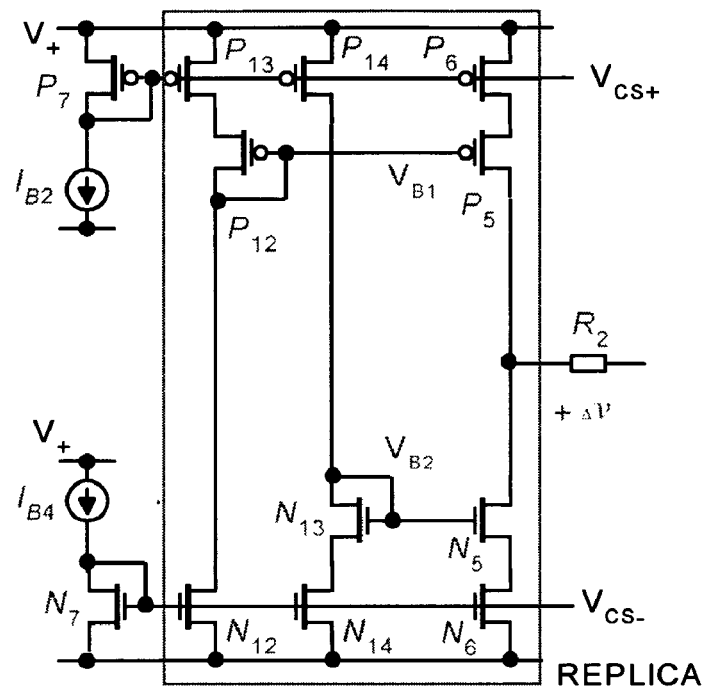
FIG. 12 shows a detailed diagram of one embodiment of a replica circuit for use in aCP.

FIG. 12 shows a detailed diagram of one embodiment of a replica circuit for use in a CP. The replica circuit sets the bias voltages $V_{B1}$ and $V_{B2}$ to properly bias current sources $P_6$ and $N_6$ in the replica circuit. Transistor $P_{12}$ duplicates transistor $P_5$ along with transistor $P_3$ (see FIG. 11) of the CP circuit. Transistor $P_{12}$ is connected as a diode to force its drain voltage to equal its gate voltage (and thus $V_{DS}$ to equal $V_{GS}$). With transistor $P_{13}$ biased at $V_{DS(sat)}$, the gate voltage of transistor $P_{12}$ corresponds to the maximum value allowed for $V_{B1}$;

$$V_{B1}=V_+-V_{DS(sat)P13}-V_{GSP12}$$

where mirror circuitry $N_7$ and $N_{12}$ establishes the proper current in transistors $P_{12}$ and $P_{13}$. Similarly, transistor $P_{14}$ establishes the proper current density needed to set the gate-source voltage of transistor $N_{13}$ and the drain-source voltage of transistor $N_{14}$ with;

$$V_{B2}=V_{GSN13}+V_{DS(sat)N14}$$

where the voltage $V_{B2}$ serves as a reference to a feedback network shown in FIG. 12.

Figure 13:
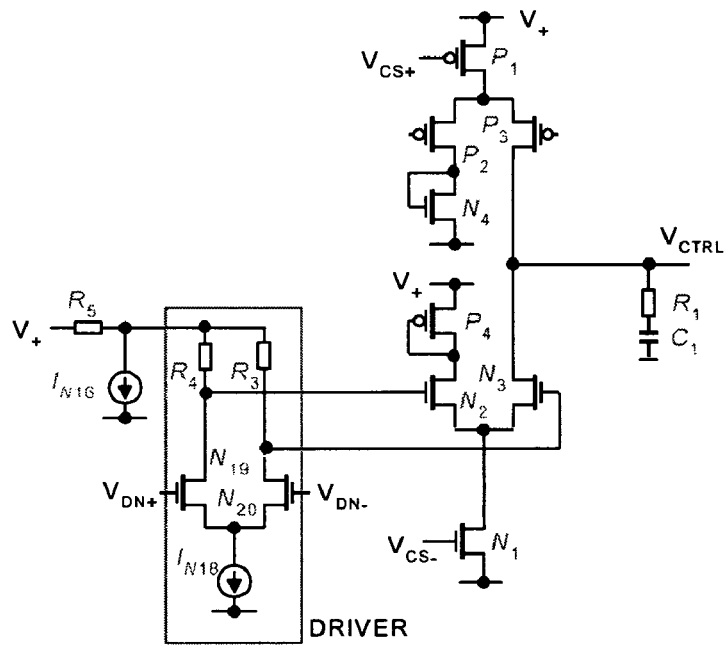
FIG. 13 shows one embodiment of a switch driver for use in a CP circuit.

FIG. 13 shows a detailed embodiment of a driver switch for use with a CP circuit. The output levels associated with the driver switch are set by current sources $I_{N16}$ and $I_{N18}$ and resistors $R_3$, $R_4$, and $R_5$ such that;

$$V_{DN+}=V_+-(I_{N16}+I_{N18})R_5 \text{ and } V_{DN-}=V_+-(I_{N16}+I_{N18})$$
$$R_5+I_{N18}R_5$$

where $R_3=R_4$ and $$I_{N18}R_4 \approx \Delta V_{UP} > \sqrt{\frac{2I}{\kappa}}$$

which assures full switching of the differential pair $N_2$, $N_3$. In addition, the voltage $V_{DN+}$ actually sets the drain voltage of the current source transistor $N_1$ with $$V_{DS(sat)N1}=V_{DN+}-V_{GSN13}$$

Note that $V_{DS(sat)}$ changes with both the drain current and the effective voltage $V_{eff}$ of the device. A similar switch driver can be used to control transistors $P_2$ and $P_3$.

Figure 14:
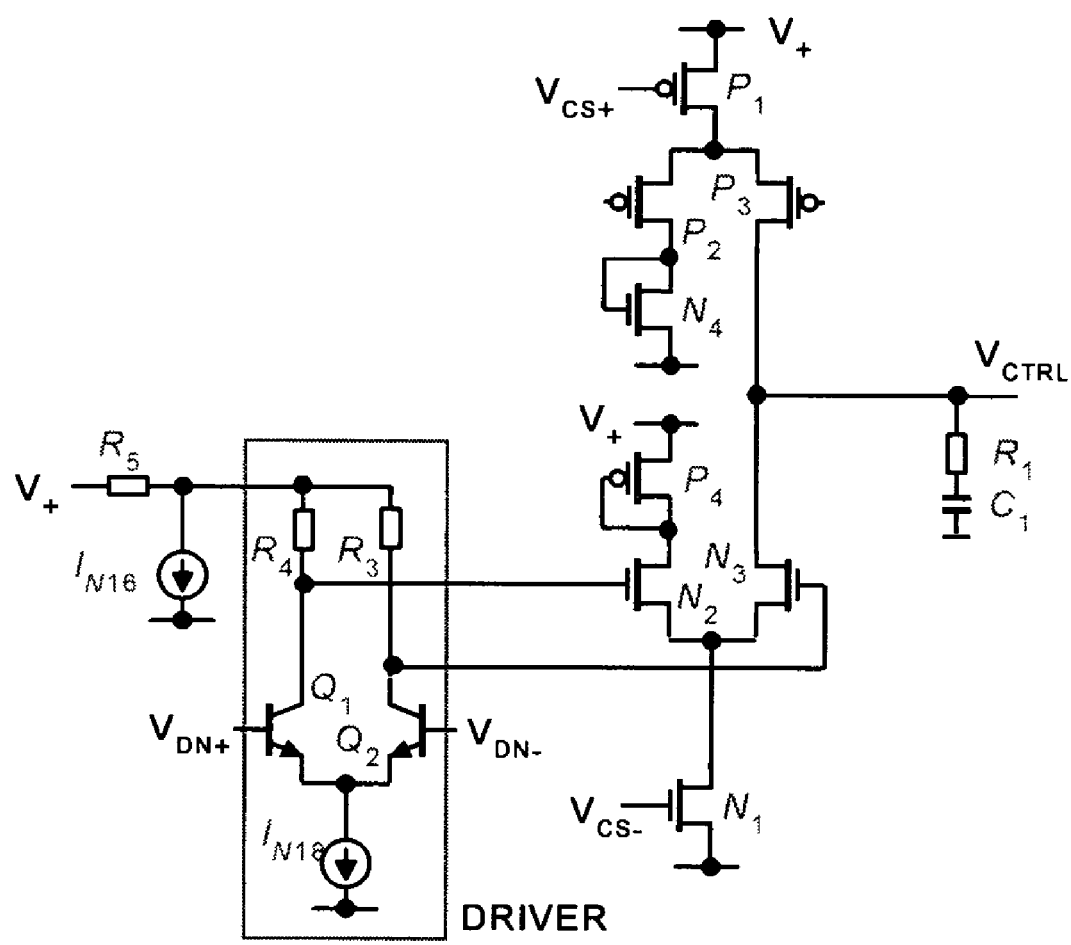
FIG. 14 shows another embodiment of a switch driver where a switch amplifier is realized as a bipolar differential pair.

FIG. 14 shows another embodiment of a switch driver where a switch amplifier is realized as a bipolar differential pair (Q1, Q2).

Figure 15:
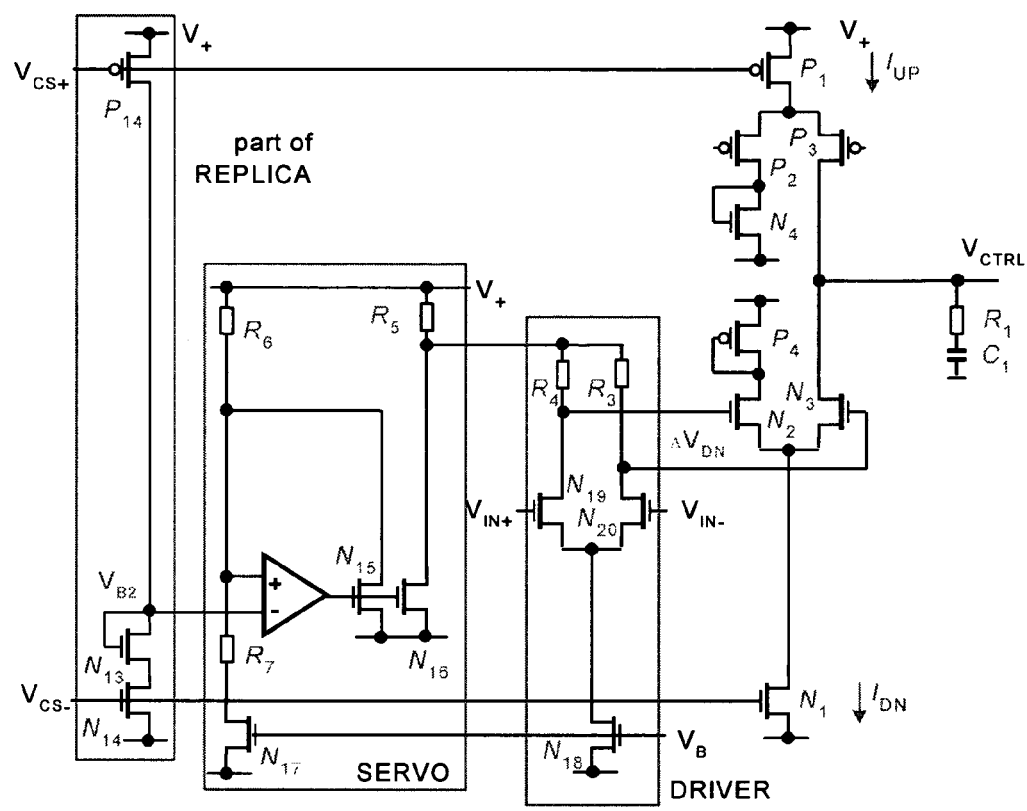
FIG. 15 shows one embodiment of a servo circuit for use with a CP circuit.

FIG. 15 shows one embodiment of a servo loop circuit for use with a CP circuit. The required drain voltage for transistor $N_1$ is set by the replica circuit and servo loop circuit. For example, the replica circuit shown in FIG. 15 may be the same replica circuit shown in FIG. 12. The replica circuit establishes a copy of the charging current $I_{UP}$ and develops a voltage $V_{B2}$ equal to;

$$V_{B2}=V_{GSN13}+V_{DS(sat)N14}$$

which corresponds to the voltage needed for $V_{DN+}$ to properly bias transistor $N_1$. This assumes matching between transistors $N_2$, $N_3$ and $N_{13}$ (to duplicate $V_{GS(on)}$) and transistors $N_3$ and $N_{14}$ (to duplicate $V_{DS(sat)}$). In turn, the servo loop circuit forces the maximum output level from the switch driver (equivalent to $V_{DN+}$) to be equal to $V_{B2}$, assuming transistors $N_{15}$ and $N_{16}$, $N_{17}$ and $N_{18}$, resistors $R_3$ and $R_7$, plus resistors $R_5$ and $R_6$ are matched. As a result, $$(I_{N15}+I_{N17})R_6+I_{N17}R_7=(I_{N16}+I_{N18})R_5+I_{N18}R_4$$

which establishes the proper output levels from the driver switch.

The above circuit descriptions remain valid even when the currents in the replica and mirror structures are lowered as long as the current density in these structures is uniform. This minimizes the overall current consumption of the CP.

These innovative circuits generate the proper switch levels, minimize the difference between the charge and discharge currents of the CP circuit, and remove many of the design restrictions associated with current source transistors. The result is a circuit with improved performance, stable $K_{PD}$, and extended control voltage range. The described circuits also allow the CP circuit to operate at lower supply voltages.

In one or more embodiments, an improved charge pump circuit is provided. Accordingly, while one or more embodiments of the charge pump circuit have been illustrated and described herein, it will be appreciated that various changes can be made to the embodiments without departing from their spirit or essential characteristics. Therefore, the disclosures and descriptions herein are intended to be illustrative, but not limiting, of the scope of the invention, which is set forth in the following claims.

What is claimed is:

1. A charge pump circuit for use in a phase-lock loop circuit, the charge pump comprising:
   a charge pump core circuit that outputs a control voltage, said charge pump core circuit including first switching elements;
   a replica circuit that is coupled to the charge pump core circuit, wherein the replica circuit receives the control voltage and produces one or more bias signals that are coupled to the charge pump core circuit to minimize the difference between charge up and charge down currents generated by the charge pump core circuit and wherein said replica circuit includes second switching elements configured such that said first switching elements and said second switching elements operate with substantially identical switching characteristics.

2. The charge pump circuit of claim 1, further comprising a buffer circuit that is coupled to receive the control voltage and output the control voltage to the replica circuit.

3. The charge pump circuit of claim 2, further comprising one or more error amplifiers that are coupled to the replica circuit and the buffer circuit, the one or more error amplifiers operate to output the one or more bias signals.

4. The charge pump circuit of claim 1, further comprising:
   a servo circuit coupled to the replica circuit to receive at least one bias signal; and
   a driver circuit coupled between the servo circuit and the charge pump core circuit.

5. A method for operating a charge pump circuit in a phase-lock loop circuit, the method comprising:
   generating an output control voltage at a charge pump core circuit;
   generating one or more bias signals based on the control voltage, wherein said generating the one or more bias signals includes receiving the control voltage at a buffer circuit operative to output a version of the control voltage and using the version of the control voltage to create, at a replica circuit, the one or more bias signals; and
   adjusting the operation of the core circuit based on the one or more bias signals so as to minimize a difference between charge up and charge down currents.

6. The method of claim 5, further comprising:
   generating a current difference based on the version of the control voltage; and
   generating the one or more bias signals based on the current difference.

7. A charge pump circuit for use in a phase-lock loop circuit, the charge pump circuit comprising;
   a charge pump core circuit means for outputting a control voltage, said charge pump core circuit means including first switching elements; and
   a replica circuit means for receiving the control voltage and producing one or more bias signals that are coupled to the charge pump core circuit means to minimize the difference between charge up and charge down currents generated by the charge pump core circuit means, said replica circuit means including second switching elements wherein substantially identical switching characteristics characterize operation of said first switching elements and said second switching elements.

8. The charge pump circuit of claim 7, further comprising a buffer circuit means for receiving the control voltage and outputting a version of the control voltage to the replica circuit means.

9. The charge pump circuit of claim 8, further comprising one or more error amplifiers means for receiving the version of the control voltage and outputting the one or more bias signals.

10. The charge pump circuit of claim 7, further comprising:
    a servo circuit means for receiving the at least one bias signal; and
    a driver circuit means coupled to the servo circuit means.

11. The charge pump circuit of claim 3 wherein said error amplifiers comprise transconductance amplifiers.

12. The charge pump circuit of claim 9 wherein said error amplifier means comprise transconductance amplifier means.

13. The charge pump circuit of claim 4 wherein said servo circuit is disposed to set the voltage of a driver used to switch a charge pump current.

14. The charge pump circuit of claim 10 wherein said servo circuit means is disposed to set the voltage of a driver means used to switch a charge pump current.

15. A charge pump circuit comprising;
    a charge pump core circuit outputting a control voltage wherein said charge pump core circuit includes a switching circuit;
    a buffer circuit coupled to said charge pump core circuit disposed to buffer said control voltage;
    replica circuit matching said charge pump core circuit for receiving the buffered control voltage and producing one or more bias signals; and
    a transconductance amplifier for generating a signal to minimize the difference between charge up and charge down currents generated by the charge pump core circuit.

16. The charge pump circuit of claim 15 further comprising a switch driver disposed to control a current switch.

17. The charge pump circuit of claim 16 wherein said switch driver comprises a field effect transistor.

18. The charge pump circuit of claim 16 wherein said switch driver comprises a bipolar junction transistor.

* * * * *